(12) United States Patent
Wei et al.

(10) Patent No.: US 7,932,477 B2
(45) Date of Patent: Apr. 26, 2011

(54) ELECTRON BEAM HEATING SYSTEM HAVING CARBON NANOTUBES

(75) Inventors: Yang Wei, Bei-Jing (CN); Liang Liu, Bei-Jing (CN); Shou-Shan Fan, Bei-Jing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 674 days.

(21) Appl. No.: 12/006,316

(22) Filed: Dec. 29, 2007

(65) Prior Publication Data

US 2009/0134127 A1    May 28, 2009

(30) Foreign Application Priority Data

Nov. 23, 2007 (CN) .......................... 2007 1 0124674

(51) Int. Cl.
*B82B 1/00* (2006.01)
(52) U.S. Cl. .................... 219/121.27; 977/742
(58) Field of Classification Search .................. None
See application file for complete search history.

(56) References Cited

U.S. PATENT DOCUMENTS

| | | | | |
|---|---|---|---|---|
| 3,869,675 A * | 3/1975 | Patz et al. | ................ | 219/121.15 |
| 6,887,450 B2 * | 5/2005 | Chen et al. | ................ | 423/445 R |
| 7,586,249 B2 | 9/2009 | Jiang et al. | | |
| 2002/0084502 A1 * | 7/2002 | Jang et al. | ..................... | 257/432 |
| 2004/0095050 A1 | 5/2004 | Liu et al. | | |
| 2006/0062944 A1 * | 3/2006 | Gardner et al. | ............. | 428/34.1 |
| 2007/0145878 A1 | 6/2007 | Liu et al. | | |
| 2007/0166223 A1 | 7/2007 | Jiang et al. | | |
| 2008/0170982 A1 | 7/2008 | Zhang et al. | | |
| 2008/0211380 A1 * | 9/2008 | Kim et al. | ..................... | 313/495 |

FOREIGN PATENT DOCUMENTS

| | | |
|---|---|---|
| CN | 1501422 A | 6/2004 |
| CN | 1941249 A | 4/2007 |
| CN | 1982209 A | 6/2007 |
| CN | 1988108 A | 6/2007 |
| CN | 101007366 A | 8/2007 |
| JP | 2003502798 | 1/2003 |
| JP | 2004303521 | 10/2004 |
| WO | WO0077813 | 12/2000 |
| WO | WO2007015710 | 2/2007 |

OTHER PUBLICATIONS

Applied Physics Letters 89, 063101 (2006), "Efficient fabrication of field electron emitters from the multiwalled carbon nanotube yarns", Wei et al, copyright 2006.*

* cited by examiner

*Primary Examiner* — Samuel M Heinrich
(74) *Attorney, Agent, or Firm* — Jeffrey T. Knapp

(57) ABSTRACT

An electron beam heating system includes a cathode, an anode, a CNT string and a chamber. The CNT string includes an end portion and an emission portion, and the end portion is contacted with and electrically connected to the cathode. The cathode, the anode and CNT string are arranged in the chamber. The CNT string is composed of a plurality of CNT bundles packed closely, each of the CNT bundles comprises a plurality of CNTs, the CNTs are substantially parallel to each other and are joined by van der Waals attractive force. Electron beams emitted from the emission portion bombard and heat a predetermined point on the anode. The heating efficiency of the electron beam heating system is high.

16 Claims, 6 Drawing Sheets

ELECTRON BEAM HEATING SYSTEM HAVING CARBON NANOTUBES

RELATED APPLICATIONS

This application is related to commonly-assigned, co-pending application: U.S. patent application Ser. No. 12/006,305, entitled "METHOD FOR MANUFACTURING FIELD EMISSION ELECTRON SOURCE HAVING CARBON NANOTUBE", filed Dec. 29, 2007, U.S. patent application Ser. No. 12/006,334, entitled "FIELD EMISSION ELECTRON SOURCE HAVING CARBON NANOTUBES AND METHOD FOR MANUFACTURING THE SAME", filed Dec. 29, 2007 and U.S. patent application Ser. No. 12/006,335, entitled "METHOD FOR MANUFACTURING FIELD EMISSION ELECTRON SOURCE HAVING CARBON NANOTUBE", filed Dec. 29, 2007. The disclosure of the respective above-identified application is incorporated herein by reference.

BACKGROUND

1. Field of the Invention

The invention relates to electron beam heating systems and, particularly, to an electron beam heating system having carbon nanotubes.

2. Discussion of Related Art

Generally, a conventional electron beam heating system includes a field emission electron source. The field emission electron source has a conducting cathode with a tapered tip that is powered with a negative voltage relative to a nearby conducting anode. Although the electron beam heating systems have proven sufficient to heat materials in macroscopic applications, the high power cost, low current density and large spot size limit their microscopic application.

Carbon nanotubes (CNTs) produced by means of arc discharge between graphite rods were first discovered and reported in an article by Sumio Iijima, entitled "Helical Microtubules of Graphitic Carbon" (Nature, Vol. 354, Nov. 7, 1991, pp. 56-58). CNTs also feature extremely high electrical conductivity, very small diameters (much less than 100 nanometers), large aspect ratios (i.e. length/diameter ratios) (greater than 1000), and a tip-surface area near the theoretical limit (the smaller the tip-surface area, the more concentrated the electric field, and the greater the field enhancement factor). These features tend to make CNTs ideal candidates for field emission electron sources.

A electron beam heating system has been disclosed. In this electron beam heating system, the single CNT is used as field emission source. When a distance between the field emission electron source and the object is about 100 micrometers, a voltage applied to the field emission electron source is about 1000Y, but only 2 microamperes of current can be emitted therefrom. Further, the controllability of the electron beam heating system is less than desired, because single CNT is so small in size.

What is needed, therefore, is an electron beam heating system having carbon nanotubes, which has high field emission efficiency, and is easily and controllably manufactured.

SUMMARY

An electron beam heating system includes a cathode, an anode, a CNT string and a chamber. The CNT string includes an end portion and an emission portion, and the end portion is contacted with and electrically connected to the cathode. The cathode, the anode and CNT string are arranged in the chamber. The CNT string is composed of a plurality of CNT bundles packed closely, each of the CNT bundles comprises a plurality of CNTs, the CNTs are substantially parallel to each other and are joined by van der Waals attractive force.

Compared with the conventional electron beam heating system, the present electron beam heating system has the following advantages: first, a CNT string, which is in a larger scale than the CNT, is used as the electron emission source, and thus the electron beam heating system is more easily controlled and can be easily made. Second, the emission portion of the CNT string is in a tooth-shape structure, which can prevent the shield effect caused by the adjacent CNTs, and the electric and thermal conductivity, and mechanical strength of the CNT string is improved. Therefore, the field emission efficiency of the CNT string is high, and thus the heating efficiency of the electron beam heating system is high.

Other advantages and novel features of the present electron beam heating system will become more apparent from the following detailed description of preferred embodiments when taken in conjunction with the accompanying drawings.

BRIEF DESCRIPTION OF THE DRAWINGS

Many aspects of the present electron beam heating system can be better understood with reference to the following drawings. The components in the drawings are not necessarily to scale, the emphasis instead being placed upon clearly illustrating the principles of the present electron beam heating system.

Figure 1:
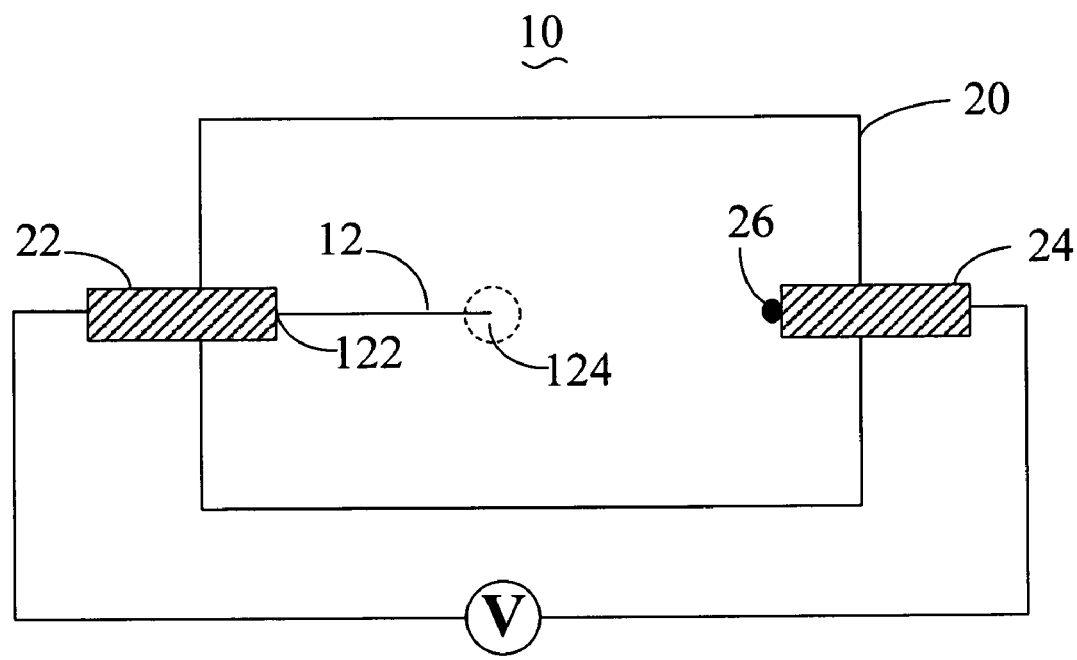
FIG. 1 is a schematic, cross-sectional view, showing the present electron beam heating system.

Corresponding reference characters indicate corresponding parts throughout the several views. The exemplifications set out herein illustrate at least one preferred embodiment of the electron beam heating system, in one form, and such exemplifications are not to be construed as limiting the scope of the invention in any manner.

DETAILED DESCRIPTION OF PREFERRED EMBODIMENTS

Reference will now be made to the drawings to describe the preferred embodiments of the present electron beam heating system, in detail.

Referring to FIG. 1, an electron beam heating system 10 includes a CNT string 12, a cathode 22, an anode 24 and a chamber 20. The CNT string 12, the cathode 22 and the anode 24 are placed in the chamber 20. The chamber 20 may be in vacuum or filled with inert gas. The vacuum is less than $2 \times 10^{-5}$ Pascal (Pa), beneficially, $2 \times 10^{-7}$ Pa. The CNT string 12 includes an end portion 122 and an emission portion 124. The CNT string 12 is attached to the cathode 22 with the end portion 122 being contacting with and electrically connecting thereto. In the present embodiment, the end portion 122 and the cathode 22 are combined together by silver paste. The cathode 22 and the anode 24 are made of an electrically conductive material, such as nickel, copper, tungsten, gold, molybdenum or platinum. The object to be heated is arranged at the point 26, and a distance between the CNT string 12 and the point 26 is in an approximate range from 20 micrometers to 2 millimeters.

The CNT string 12 is composed of a number of closely packed CNT bundles, and each of the CNT bundles includes a number of CNTs, which are substantially parallel to each other and are joined by van der Waals attractive force. A diameter of the CNT string 12 is in an approximate range from 1 to 100 microns (μm), and a length thereof is in an approximate range from 0.1-10 centimeters (cm).

Figure 2:
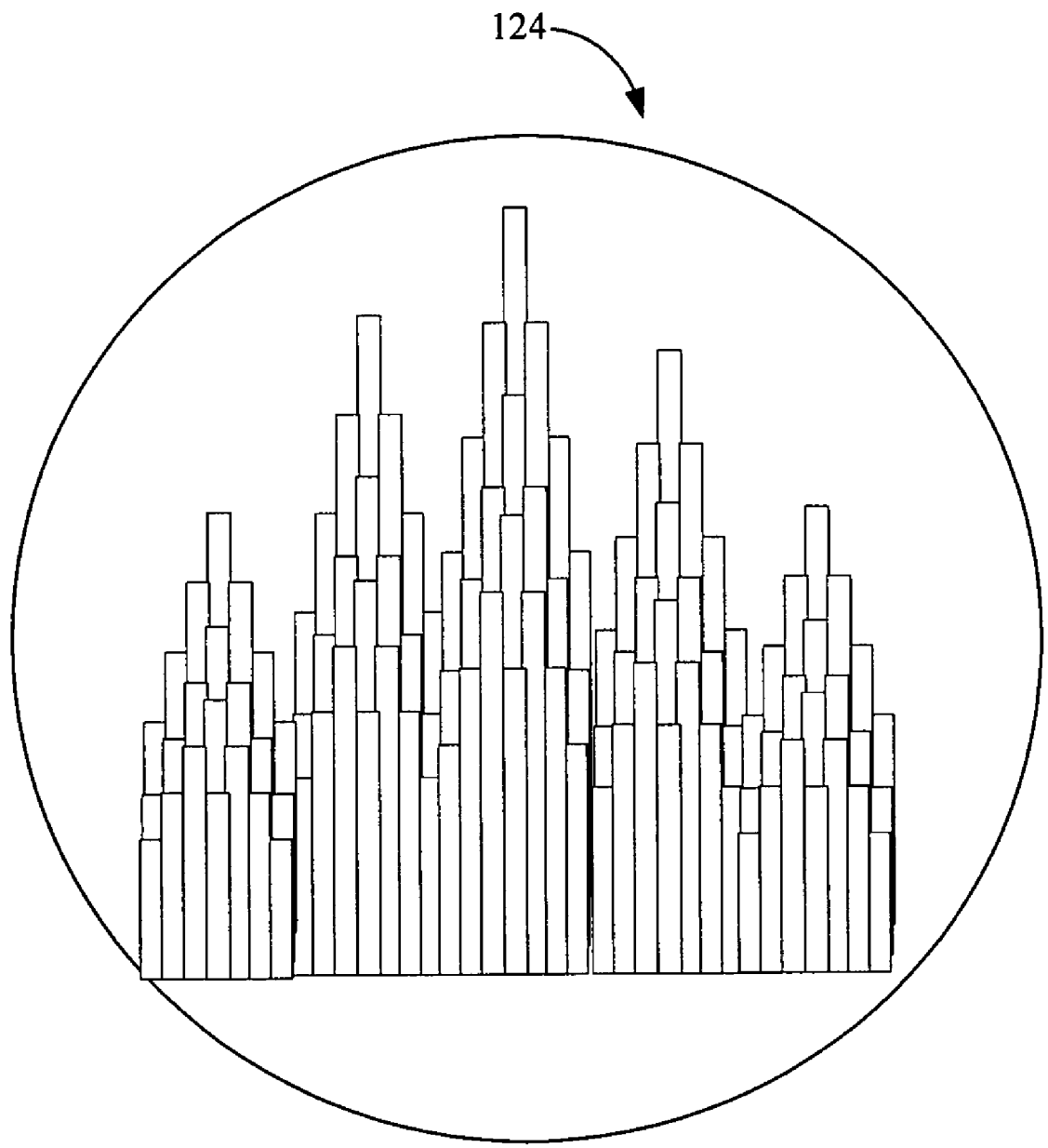
FIG. 2 is a schematic, amplificatory view of 124 part in FIG. 1.
Figure 3:
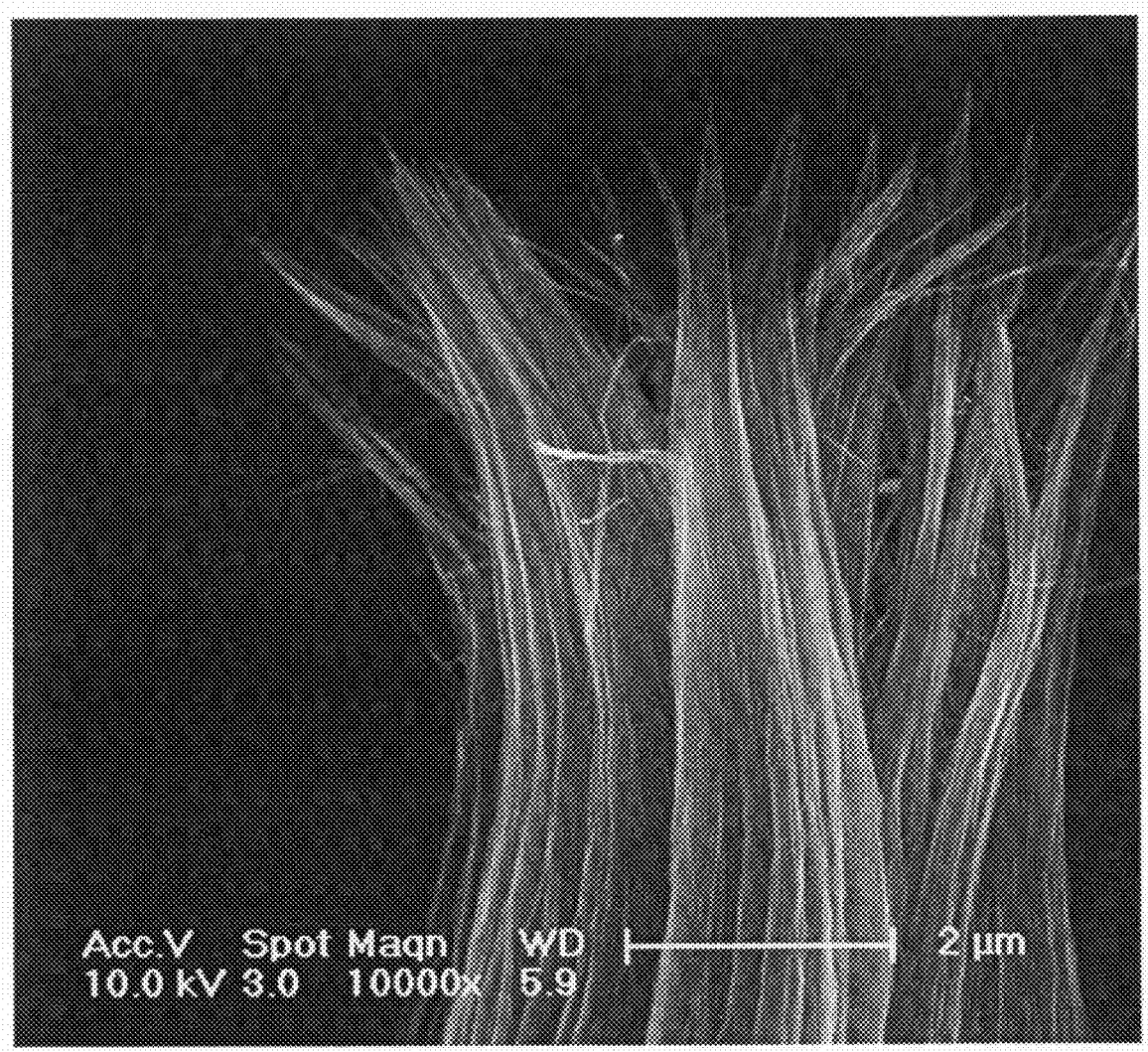
FIG. 3 is a Scanning Electron Microscope (SEM) image, showing 124 part in FIG. 2.
Figure 4:
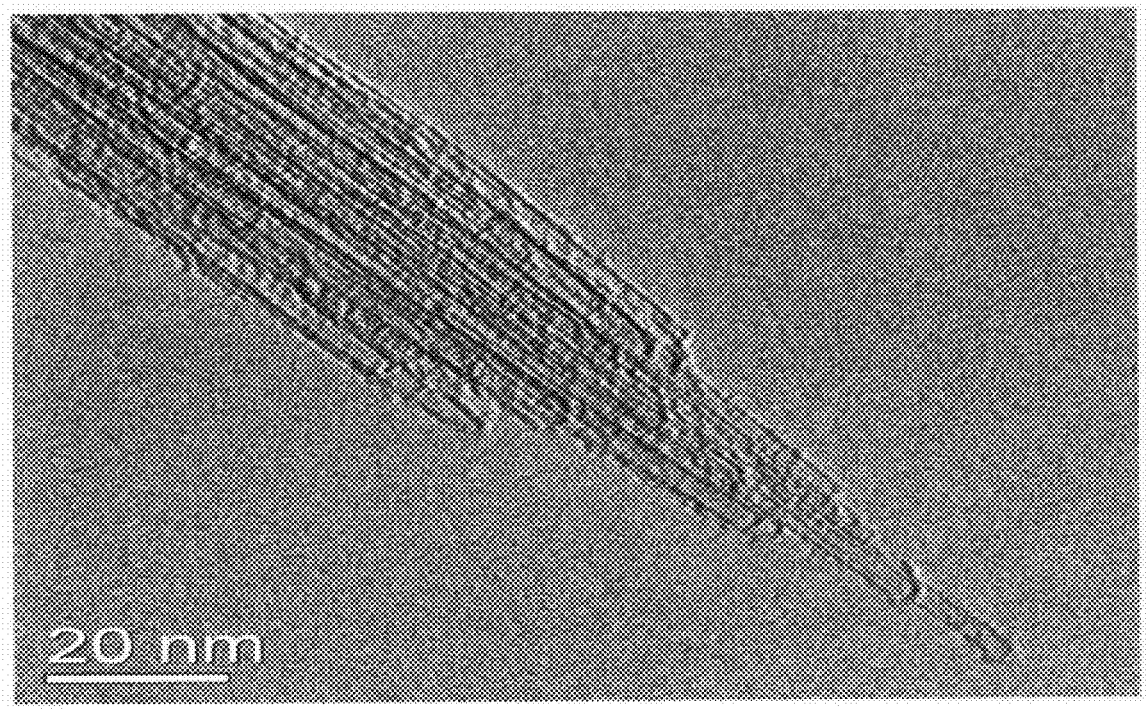
FIG. 4 is a Transmission Electron Microscope (TEM) image, showing 124 part in FIG. 2.

Referring to FIGS. 2, 3 and 4, the CNTs at the emission portion 124 form a tooth-shaped structure, wherein some CNTs are taller than and project above the adjacent CNTs, each projecting CNT functioning as an electron emitter. The CNTs at the emission portion 124 have smaller diameter and fewer number of graphite layer, typically, less than 5 nanometer (nm) in diameter and about 2-3 in wall. However, the CNTs in the CNT string 12 other than the emission portion 124 are about 15 nm in diameter and more than 5 in wall.

In operation, electron beams are emitted from the emission portion 124 and bombard the point 26 on the anode 24, and then a temperature of the point 26 increases. The temperature thereof is determined by many facts, such as a distance between the CNT string 12 and the point 26, a material of the point 26 made of, and a power applied to the CNT string that is a product of the voltage applied between the cathode 22 and the anode 24 and the field emission current of the CNT string 12.

A method for providing the CNT string 12 is described in the commonly-assigned copending application Ser. No. 12/006,335, entitled "METHOD FOR MANUFACTURING FIELD EMISSION ELECTRON SOURCE HAVING CARBON NANOTUBES", which is incorporated herein by reference. The method for manufacturing a field emission electron source is illustrated as following steps: (1) providing a CNT array; (2) drawing a number of CNT bundles from the CNT array to form a CNT yarn; (3) soaking the CNT yarn in an organic solvent, and shrinking the CNT yarn into a CNT thread after the organic solvent volatilizing; (4) applying a voltage between two opposite ends of the CNT thread, until the CNT thread snaps at a certain point, and finally achieving CNT threads 12 each with a emission portion 124.

In step (1), the CNT array is a super-aligned CNT array, which is grown using a chemical vapor deposition method. The method is described in U.S. Pat. No. 7,045,108, which is incorporated herein by reference. Firstly, a substrate is provided, and the substrate is a substrate of p type silicon or n type silicon. Secondly, a catalyst layer is deposited on the substrate. The catalyst layer is made of a material selected from a group consisting of iron (Fe), cobalt (Co), nickel (Ni), and their alloys. Thirdly, the substrate with the catalyst layer is annealed at a temperature in an approximate range from 300 to 400 degrees centigrade under a protecting gas for about 10 hours. Fourthly, the substrate with the catalyst layer is heated to approximately 500 to 700 degrees centigrade and a mixed gas including a carbon containing gas and a protecting gas is introduced for about 5 to 30 minutes to grow a super-aligned CNTs array. The carbon containing gas can be a hydrocarbon gas, such as acetylene or ethane. The protecting gas can be an inert gas. The grown CNTs are aligned parallel in columns and held together by van der Waals force interactions. The CNTs array has a high density and each one of the CNTs has an essentially uniform diameter.

In step (2), a CNT yarn may be obtained by drawing a bundle of the CNTs from the super-aligned CNTs array. Firstly, a bundle of the CNTs including at least one CNT are selected. Secondly, the bundle of the CNTs is drawn out using forceps or adhesive tap, to form a CNT yarn along the drawn direction. The bundles of the CNT s are connected together by van der Waals force interactions to form a continuous CNT yarn. Further, the CNT yarn can be treated by a conventional spinning process, and a CNT yarn in a twist shape is achieved.

In step (3), the CNT yarn is soaked in an organic solvent. The step is described in U.S. Pat. Pub. No. 2007/0166223, which is incorporated herein by reference. Since the untreated CNT yarn is composed of a number of the CNTs, the untreated CNT yarn has a high surface area to volume ratio and thus may easily become stuck to other objects. During the surface treatment, the CNT yarn is shrunk into a CNT thread after the organic solvent volatilizing, due to factors such as surface tension. The surface area to volume ratio and diameter of the treated CNT thread is reduced. Accordingly, the stickiness of the CNT yarn is lowered or eliminated, and strength and toughness of the CNT thread is improved. The organic solvent may be a volatilizable organic solvent, such as ethanol, methanol, acetone, dichloroethane, chloroform, and any combination thereof.

In step (4), when the voltage is applied to the CNT thread, a current flows through the CNT thread. Consequently, the CNT thread is heated by Joule-heating, and a temperature of the CNT thread can reach an approximate range from 2000 to 2400 Kelvin (K). The resistance at the points distributing along the long axial of the CNT thread is different, and thus the temperature distributing along the long axial of the CNT thread is different. The greater the resistance and higher the temperature, the more easily snapped. In the present embodiment, after less than 1 hour (h), the CNT thread is snapped and two CNT strings 12 respectively having an emission portion 124 are formed.

The CNTs at the emission portion 124 have smaller diameter and fewer number of graphite layer, typically, less than 5 nanometers (nm) in diameter and about 2-3 in wall. However, the CNTs in the CNT string 12 other than the emission portion 124 are about 15 nm in diameter and more than 5 in wall. It can be concluded that the diameter and the number of the graphite layers of the CNTs are decreased in a vacuum breakdown process. A wall by wall breakdown of CNTs is due to Joule-heating at a temperature higher than 2000K, with a current decrease process. The high-temperature process can efficiently remove the defects in CNTs, and thus the electric and thermal conductivity and mechanical strength of the CNT string 12 are improved. Therefore, the field emission efficiency of the CNT string 12 is improved.

Moreover, during snapping, some carbon atoms vapor from the CNT string 12. After snapping, a micro-fissure is formed between two emission portions 124, the arc discharge may occur between the micro-fissure, and then the carbon atoms are transformed into the carbon ions due to ionization. These carbon ions bombard/etch the emission portions 124, and then the emission portion 124 form the tooth-shaped structure. Therefore, a shield effect caused by the adjacent CNTs can be reduced. The field emission efficiency of the CNT string 12 is further improved.

Figure 5:
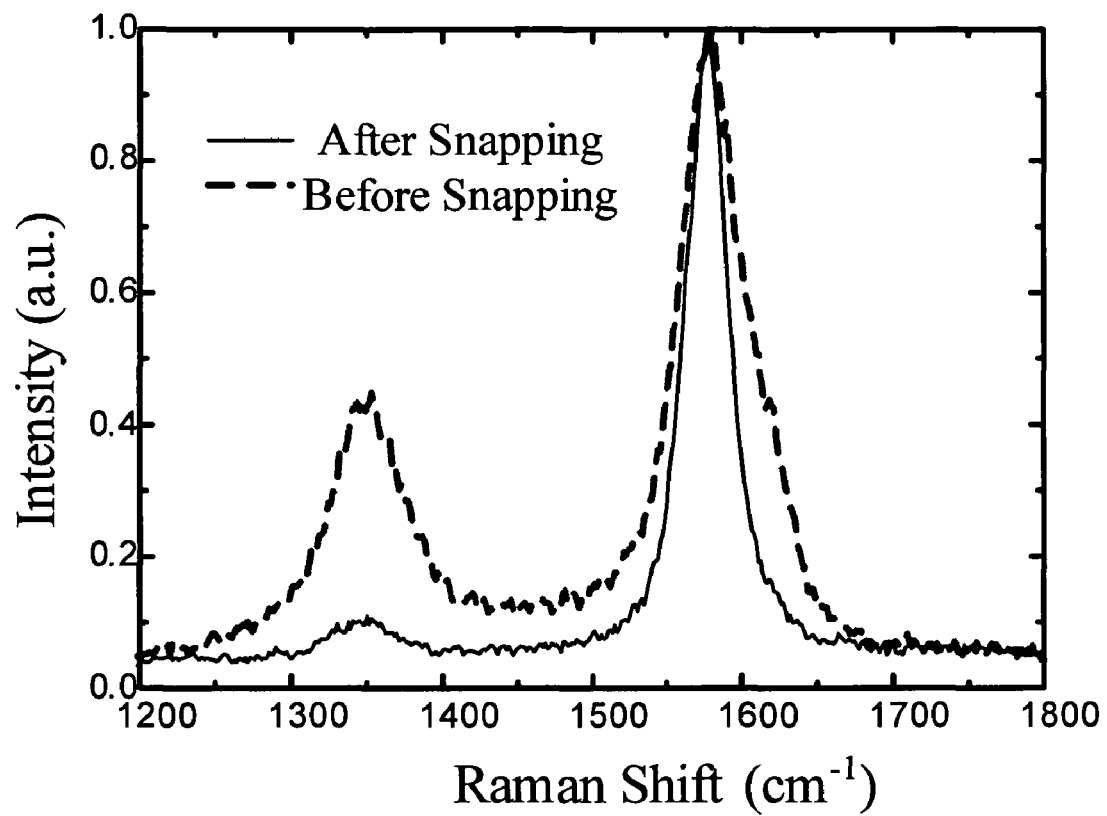
FIG. 5 is a current-voltage graph of the present electron beam heating system.

FIG. 5 shows an I-V graph of the CNT string 12. A threshold voltage of the CNT string 12 is about 250 V, and an emission current thereof is over 150 μA. The diameter of the emission portion is about 5 μm, and thus a current density can be calculated over 700 A/cm$^2$. The inset of FIG. 5 shows a Fowler-Nordheim (FN) plot, wherein the straight line (ln(I/V$^2$) via 1/V) indicate a typical field emission efficiency of the CNT string 12.

Figure 6:
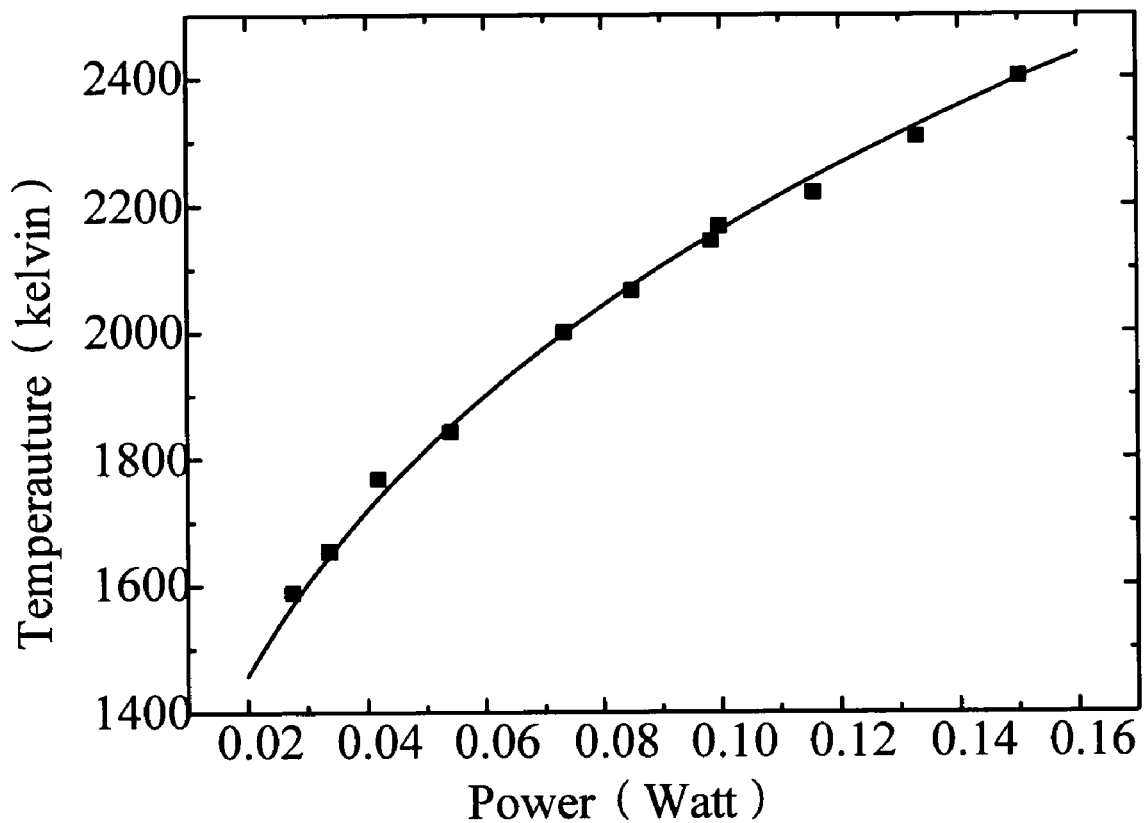
FIG. 6 is a temperature-power graph of the present electron beam heating system.

FIG. 6 shows a temperature-power graph of the electron beam heating system 10. In the present embodiment, the point

26 is an end of a CNT, the distance between the CNT string 12 and the point 26 is about 30 micrometers. When the power is 0.08 Watts (W), the temperature of point 26 can reach 2000 K.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. An electron beam heating system comprising:
    a cathode;
    an anode; and
    a carbon nanotube string, wherein the carbon nanotube string comprises an end portion and an emission portion, the end portion is in direct electrical contact with the cathode, the carbon nanotube string is composed of a plurality of carbon nanotube bundles packed closely, each of the carbon nanotube bundles comprises a plurality of carbon nanotubes, the carbon nanotubes are substantially parallel to each other and are joined by van der Waals attractive force, the emission portion comprises a plurality of carbon nanotube bundles forming a tooth-shaped structure;
    a chamber, wherein the cathode, the anode and the carbon nanotube string are located in the chamber.

2. The electron beam heating system as claimed in claim 1, wherein a distance between the emission portion and the predetermined point is in a range from about 20 micrometers to about 2 millimeters.

3. The electron beam heating system as claimed in claim 1, wherein the chamber is under vacuum.

4. The electron beam heating system as claimed in claim 1, wherein the tooth-shaped structure comprises a plurality of projecting carbon nanotubes, each of the plurality of projecting carbon nanotubes is taller than and projects above adjacent carbon nanotubes, each of the plurality of projecting carbon nanotubes functions as an electron emitter.

5. The electron beam heating system as claimed in claim 1, wherein the carbon nanotubes in the emission portion have a diameter of less than 5 nanometers.

6. The electron beam heating system as claimed in claim 1, wherein each carbon nanotubes at the emission portion comprises a plurality of graphite layers and the number of the graphite layers is about 2 or 3.

7. The electron beam heating system as claimed in claim 1, wherein the carbon nanotubes in the carbon nanotube string, other than those in the emission portion, have a diameter of about 15 nanometers.

8. The electron beam heating system as claimed in claim 1, wherein the number of graphite layer of the carbon nanotubes in the carbon nanotube string other than those in the emission portion is more than 5 layers.

9. The electron beam heating system as claimed in claim 1, wherein a diameter of the carbon nanotube string is in a range from about 1 to about 100 micrometers.

10. The electron beam heating system as claimed in claim 1, wherein the anode is a carbon nanotube.

11. The electron beam heating system as claimed in claim 1, wherein the shape of each of the plurality of carbon nanotube bundles is a tapered, and the plurality of carbon nanotube bundles is a plurality of tapered carbon nanotube bundles.

12. The electron beam heating system of claim 11, wherein each of the plurality of tapered carbon nanotube bundles comprises a plurality of carbon nanotubes substantially parallel to each other and joined by van der Waals attractive force.

13. The electron beam heating system of claim 12, wherein in each of the plurality of tapered carbon nanotubes bundles, a single carbon nanotube of is taller than and projects over other carbon nanotubes.

14. The electron beam heating system of claim 13, wherein in each of the plurality of tapered carbon nanotubes bundles, the single carbon nanotube is located in substantially the middle of the other carbon nanotubes.

15. The electron beam heating system of claim 12, wherein a diameter of each of the plurality of carbon nanotubes is less than 5 nanometers, and the number of graphite layers of each of the plurality of carbon nanotubes is 2 or 3.

16. The electron beam heating system of claim 12, wherein in each of the plurality of tapered carbon nanotubes bundles, a height of the plurality of carbon nanotubes gradually becomes taller from outermost carbon nanotubes to innermost carbon nanotubes.

* * * * *